(12) United States Patent
Okamoto

(10) Patent No.: US 10,438,668 B2
(45) Date of Patent: Oct. 8, 2019

(54) POWER SUPPLY MANAGEMENT DEVICE AND MEMORY SYSTEM

(71) Applicant: TOSHIBA MEMORY CORPORATION, Minato-ku, Tokyo (JP)

(72) Inventor: Wataru Okamoto, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 46 days.

(21) Appl. No.: 15/695,982

(22) Filed: Sep. 5, 2017

(65) Prior Publication Data

US 2018/0261293 A1    Sep. 13, 2018

(30) Foreign Application Priority Data

Mar. 10, 2017   (JP) ................................. 2017-045793

(51) Int. Cl.

| G11C 16/30 | (2006.01) |
|---|---|
| G11C 16/34 | (2006.01) |
| G11C 11/00 | (2006.01) |
| G11C 11/4074 | (2006.01) |

(52) U.S. Cl.
CPC ............ G11C 16/30 (2013.01); G11C 11/005 (2013.01); G11C 11/4074 (2013.01); G11C 16/3459 (2013.01)

(58) Field of Classification Search
CPC ............................ G11C 16/30; G11C 16/3459
See application file for complete search history.

(56) References Cited

U.S. PATENT DOCUMENTS

| 9,563,438 B2 | 2/2017 | Krishnamurthy et al. |
|---|---|---|
| 9,588,559 B2 | 3/2017 | Venishetti et al. |
| 2012/0218817 A1* | 8/2012 | Kang ............... G11C 11/5628 365/185.2 |
| 2013/0051151 A1* | 2/2013 | Ito ........................ G11C 5/147 365/185.18 |
| 2014/0091867 A1* | 4/2014 | Nonoyama ............ H03L 1/023 331/70 |
| 2015/0006943 A1 | 1/2015 | Suzuki |
| 2016/0191057 A1* | 6/2016 | Forghani-Zadeh ........................ H03K 19/017509 327/109 |

* cited by examiner

*Primary Examiner* — Tri M Hoang
(74) *Attorney, Agent, or Firm* — Foley & Lardner LLP

(57) ABSTRACT

A power supply management device includes a first input terminal that receives an input voltage, and a first power supply circuit that outputs a voltage obtained by converting the input voltage. The first power supply circuit further outputs a first voltage responsive to a first signal being received by the first input terminal. The first power supply circuit yet further outputs a second voltage responsive to a second signal different from the first signal being received by the first input terminal.

20 Claims, 13 Drawing Sheets

FIG. 7

| SETTING SIGNAL | SETTING INFORMATION | OUTPUT VOLTAGE SETTING | | | |
|---|---|---|---|---|---|
| | | POWER SUPPLY 35A | POWER SUPPLY 35B | POWER SUPPLY 35C | POWER SUPPLY 35D |
| "00" | FIRST | NAND(A) | NAND(A) | DRAM(A) | DRAM(A) |
| "01" | SECOND | NAND(A) | NAND(A) | DRAM(B) | DRAM(B) |
| "10" | THIRD | NAND(B) | NAND(B) | DRAM(A) | DRAM(A) |
| "11" | FOURTH | NAND(B) | NAND(B) | DRAM(B) | DRAM(B) |

FIG. 9

| RESISTANCE VALUE | | OUTPUT VOLTAGE Vout | SETTING INFORMATION |
|---|---|---|---|
| RESISTOR R1 | RESISTOR R2 | | |
| 3kΩ | 1kΩ | 0.25V | FIRST |
| 1kΩ(3kΩ) | 1kΩ(3kΩ) | 0.5V | SECOND |
| 1kΩ | 3kΩ | 0.75V | THIRD |

FIG. 11

| SETTING INFORMATION | SWITCH SW1 | SWITCH SW2 |
|---|---|---|
| FIRST (SAS) | ON | ON |
| SECOND (PCIe) | ON | OFF |

POWER SUPPLY MANAGEMENT DEVICE AND MEMORY SYSTEM

CROSS-REFERENCE TO RELATED APPLICATION

This application claims the benefit of and priority to Japanese Patent Application No. 2017-045793, filed Mar. 10, 2017, the entire contents of which are incorporated herein by reference.

FIELD

Embodiments described herein relate generally to a power supply management device and a memory system.

BACKGROUND

A Solid State Drive (SSD) mounted with a nonvolatile semiconductor memory such as a negative-AND (NAND) flash memory can be used as an external storage device used for a computer system.

DESCRIPTION OF THE DRAWINGS

FIG. 7 is a table of an example of setting information in some embodiments of the power supply management device according to the second aspect.

FIG. 9 is a table of an example of setting information in some embodiments of the power supply management device according to the third aspect.

FIG. 11 is a table of an example of setting information in some embodiments of the power supply management device according to the fourth aspect.

DETAILED DESCRIPTION

Figure 1:
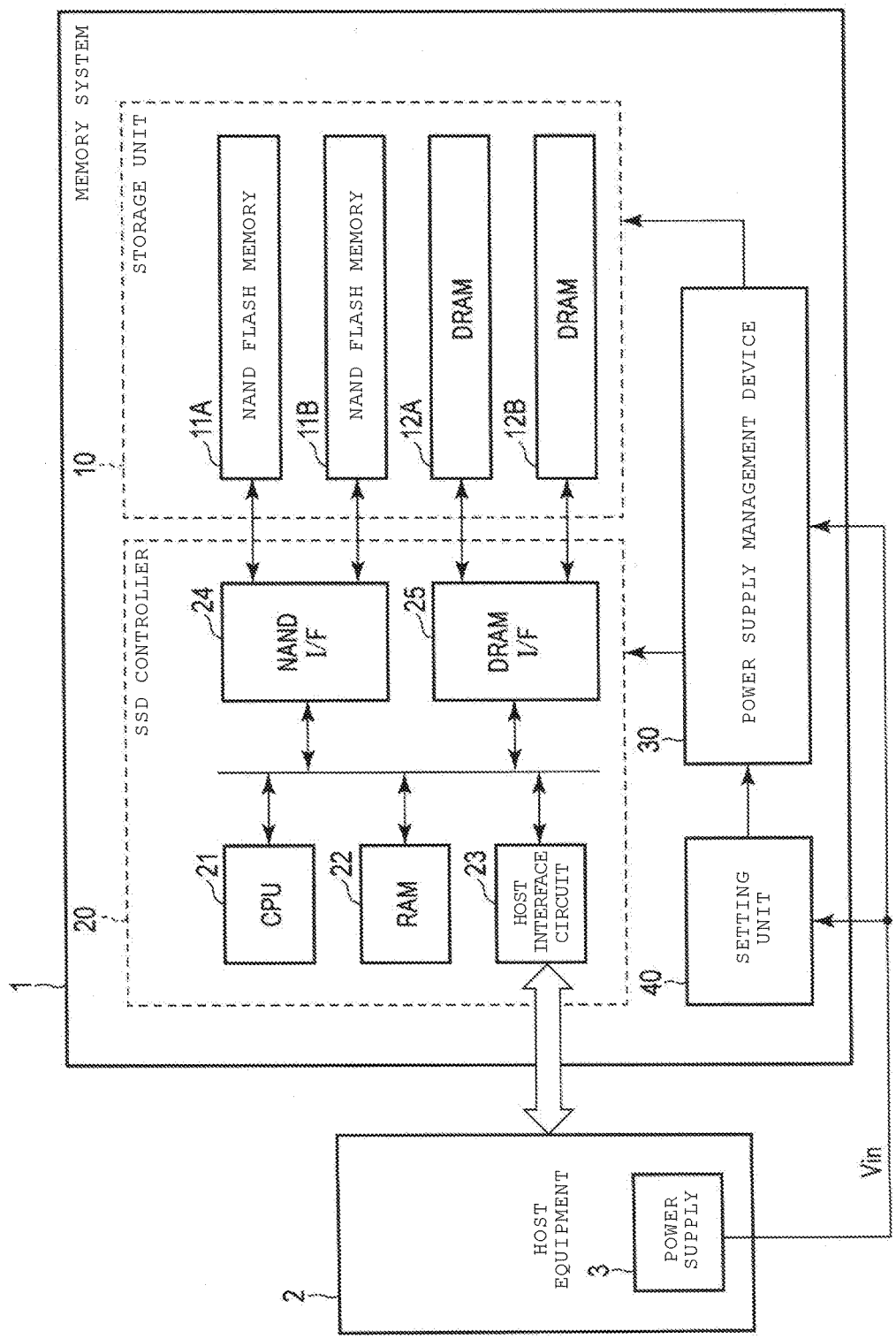
FIG. 1 is a block diagram of some embodiments of a memory system according to a first aspect (We have a question. Is it better to use "aspect" than "embodiment"?).

Some embodiments provide for a power supply management device capable of using a plurality of power supply settings without changing a device configuration, and a memory system including the power supply management device.

In general, according to some embodiments described herein, the power supply management device includes a first input terminal and a first power supply circuit which outputs a voltage obtained by converting an input voltage. After power is supplied to the power supply management device, in a case where a first signal is input to the first input terminal, the first power supply circuit outputs a first voltage and in a case where a second signal different from the first signal is input to the first input terminal, the first power supply circuit outputs a second voltage different from the first voltage.

In some embodiments, according to one aspect, a power supply management device includes a first input terminal configured to receive an input voltage, and a first power supply circuit configured to output a voltage obtained by converting the input voltage. The first power supply circuit is configured to output a first voltage responsive to a first signal being received by the first input terminal. The first power supply circuit is further configured to output a second voltage responsive to a second signal different from the first signal being received by the first input terminal.

In some embodiments, according to another aspect, a memory system includes a storage unit which comprises a first memory and a controller circuit configured to control the storage unit. The memory system further includes a power supply management device which includes a first input terminal configured to receive a first input voltage and a first power supply circuit configured to convert the first input voltage and to supply the converted voltage to the first memory. The memory system further includes a setting circuit configured to input a setting signal to the first input terminal. The first power supply circuit is configured to output a first voltage responsive to the setting signal being a first signal and the first power supply circuit is configured to output a second voltage responsive to the setting signal being a second signal.

Hereinafter, embodiments will be described with reference to the drawings. The drawings are schematic diagrams. In the following description, components having similar, or substantially the same functions and configurations are denoted by the same reference numerals. Respective labels for components having a similar or same configuration may include different letters to distinguish the components. In some cases described herein where it is not convenient to distinguish components in the manner described above, the components may be collectively referred to by a numerical label that does not include a letter.

1. First Aspect

Hereinafter, some embodiments of a power supply management device and a memory system according to a first aspect will be described. In the following description, a case where the memory system is an SSD will be described by way of example; however, other types of memory systems may be implemented.

1-1. Configuration of Memory System 1

First, a configuration of some embodiments of a memory system 1 will be described with reference to FIG. 1. FIG. 1 illustrates a block diagram of the memory system 1. As illustrated in FIG. 1, the memory system 1 includes a storage unit 10, an SSD controller 20, a power supply management device 30, and a setting unit 40.

The storage unit 10 includes a plurality of semiconductor memories which can store data and can operate independently of each other. The storage unit 10 includes, for example, NAND flash memories 11A and 11B and/or Dynamic Random Access Memories (DRAMS) 12A and 12B. The NAND flash memory 11 and the DRAM 12 are respectively an example of a nonvolatile memory and a volatile memory. In other embodiments, any other appropriate number or type of semiconductor memories may be used. For example, the storage unit 10 may use a Magnetoresistive Random Access Memory (MRAM), a Ferroelectric Random Access Memory (FeRAM), or the like as a nonvolatile memory and may use Static Random Access Memory (SRAM) or the like as a volatile memory.

Based on a command from, for example, external host equipment 2, the SSD controller 20 commands the storage unit 10 to perform various types of operation. The SSD controller 20 is an integrated circuit (IC) such as a system on chip (SoC), a field-programmable grid array (FPGA), an application specific IC (ASIC), and the like. The SSD controller 20 includes, for example, a processor (CPU) 21, an embedded memory (RAM) 22, a host interface circuit 23, a NAND interface (I/F) circuit 24, and a DRAM interface circuit 25.

The CPU 21 is a processor which controls operation of the overall SSD controller 20. For example, the CPU 21 issues a write command to the NAND interface circuit 24 in response to a write command received from the host equipment 2. In addition, the CPU 21 executes various processes for managing a memory space of the storage unit 10, such as wear leveling.

The RAM 22 is, for example, a semiconductor memory such as an SRAM and stores parameters for managing the storage unit 10, various management tables, and the like. In addition, the RAM 22 is used by the CPU 21 to perform operations.

The host interface circuit 23 is connected to the host equipment 2 and controls communication with the host equipment 2. For example, the host interface circuit 23 controls transmission between the memory system 1 and the host equipment 2, including transmission of data, commands, and/or addresses. As the host interface circuit 23, communication interface standards such as Serial Advanced Technology Attachment (SATA), Serial Attached Small-Computer-System-Interface (SCSI) (SAS), PERIPHERAL COMPONENT INTERCONNECT (PCI) EXPRESS (registered trademark) (PCIe), and the like are used. The host equipment 2 connected to the memory system 1 may include, for example, a computer or the like including an interface such as SATA, SAS, PCIe or the like.

The NAND interface circuit 24 is connected to the NAND flash memories 11A and 11B, and controls communication with the NAND flash memory 11. The DRAM interface circuit 25 is connected to the DRAMs 12A and 12B, and controls communication with the DRAM 12. Any other configuration of each of the interface circuits 24 and 25 may be used, and can be changed based on types of nonvolatile memory and volatile memory included in the storage unit 10.

The power supply management device 30 is, for example, a Power Management IC (PMIC) and is a one-chip microcomputer for managing a power supply of the memory system 1. For example, the power supply management device 30 converts an external power supply voltage supplied to the memory system 1 into an internal power supply voltage for the modules such as the storage unit 10, the SSD controller 20, and the like, and may supply an appropriate power supply voltage to the modules. In addition, based on information received from the setting unit 40, the power supply management device 30 can change a voltage value of the internal power supply voltage supplied to the modules.

The host equipment 2 connected to the memory system 1 described above includes a power supply 3. When the host equipment 2 uses the memory system 1, the power supply 3 can supply an external power supply voltage Vin to the power supply management device 30 and the setting unit 40.

Figure 2:
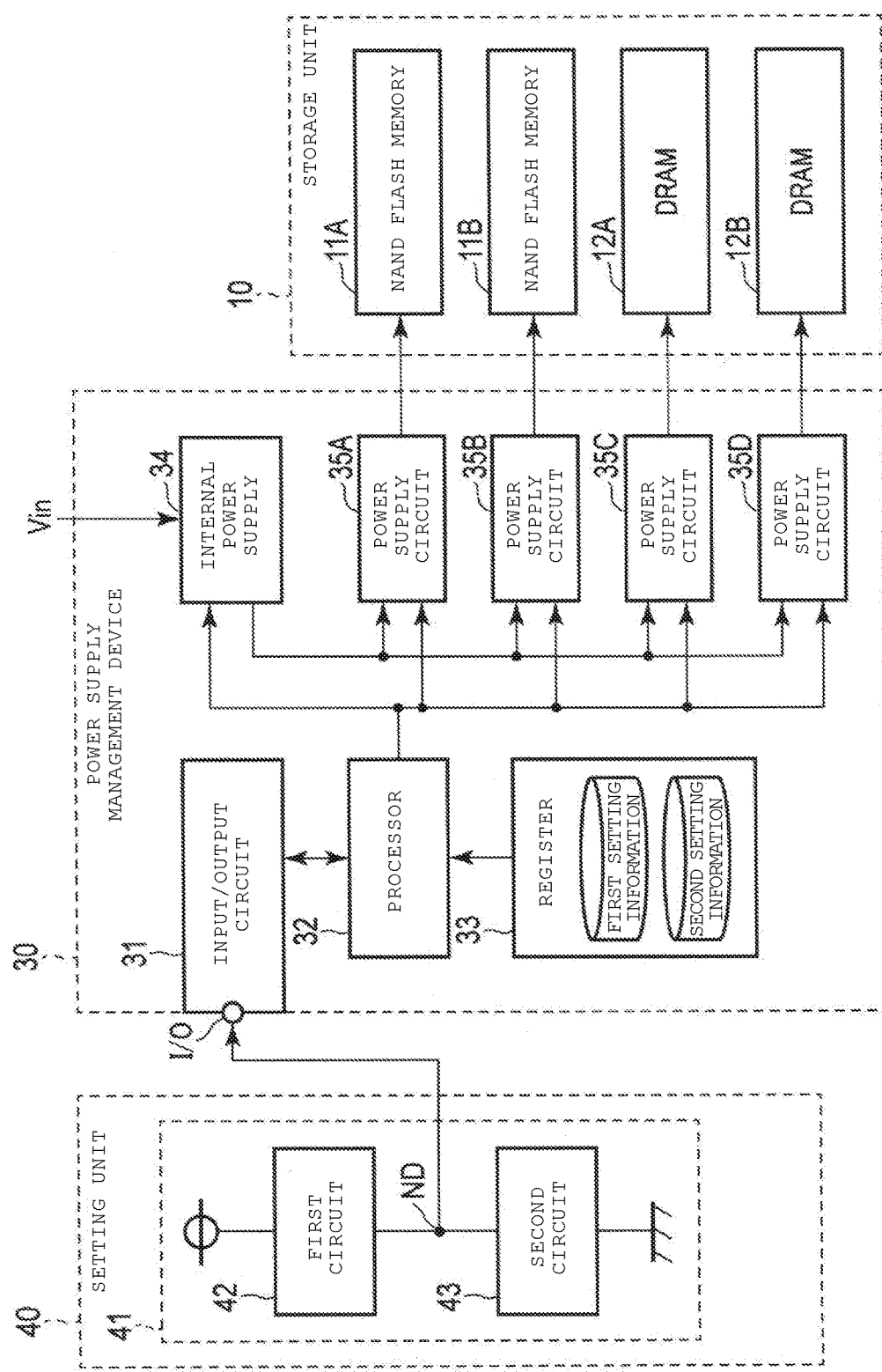
FIG. 2 is a block diagram of some embodiments of a power supply management device and a setting circuit according to the first aspect.

Hereinafter, an example configuration of the power supply management device 30 and the setting unit 40 will described in detail with reference to FIG. 2. FIG. 2 illustrates a block diagram of the power supply management device 30 and the setting unit 40. As illustrated in FIG. 2, the power supply management device 30 includes an input/output circuit 31, a processor 32, a register 33, an internal power supply 34, and power supply circuits 35A, 35B, 35C, and 35D.

The input/output circuit 31 includes, for example, a plurality of input/output terminals. The input/output terminal is, for example, a general purpose input/output terminal (GPIO) capable of being used for various purposes depending on a setting. In some embodiments according to the first aspect, of the plurality of input/output terminals, at least one input/output terminal I/O (e.g. only one input/output terminal I/O) is connected to the setting unit 40.

The processor 32 is an arithmetic circuit that controls operation of the overall power supply management device 30. For example, based on a logic state of the input/output terminal I/O connected to the setting unit 40, the processor 32 loads setting information stored in the register 33. Based on the loaded setting information, the processor 32 controls the internal power supply 34 and the power supply circuits 35A-35D.

The register 33 stores one or more parameters and the like for operation of the power supply management device 30. As the register 33, a rewritable memory circuit (for example, a flip-flop or the like) is used. In some embodiments according to the first aspect, the register 33 stores first setting information and second setting information, including information related to a setting of a power supply circuit for operation of the modules of the memory system 1. The first setting information and second setting information include, for example, information used for the power supply circuit 35, respectively.

Based on control of the processor 32, the internal power supply 34 supplies a voltage supplied from an external of the memory system 1 to the power supply circuit 35. In addition, based on the setting information, the internal power supply 34 can boost or step down the voltage supplied from the external of the memory system 1 (e.g. prior to supplying the voltage to the power supply circuit 35).

Based on control of the processor 32, the power supply circuit 35 can operate as a DC/DC converter which generates a voltage appropriate for operation of at least one of (e.g. any of) the modules of the memory system 1 from a voltage supplied by the internal power supply 34. In other words, the power supply circuit 35 converts the voltage supplied by the internal power supply 34 into an internal power supply voltage for operation of the modules of the memory system 1. The power supply circuits 35A, 35B, 35C, and 35D may generate voltages different from each other. For example, the power supply circuits 35A and 35B supply internal power supply voltages respectively generated for the NAND flash memories 11A and 11B, and the power supply circuits 35C and 35D supply internal power supply voltages respectively generated for the DRAMs 12A and 12B. At least some of these power supply voltages may differ. In some embodiments according to the first aspect, the number of the power supply circuit 35 corresponds to the number of semiconductor memories provided in the storage unit 10. It should be noted that the present disclosure is not limited thereto. For example, the power supply management device 30 may include a power supply circuit 35 corresponding to the SSD controller 20 or a power supply circuit 35 corresponding to another IC (not illustrated).

The setting unit 40 includes a setting circuit 41. The setting circuit 41 includes a first circuit 42 and a second circuit 43. The setting circuit 41 supplies a desired setting signal to the input/output terminal I/O of the input/output circuit 31 by using at least one of the first circuit 42 and the second circuit 43.

A node ND in the setting circuit 41 is connected to the input/output terminal I/O. The node ND is connected to a power supply via the first circuit 42 and is connected to a ground via the second circuit 43. Either or both of first circuit 42 and the second circuit 43 can be configured, for example, as a resistance circuit, a short circuit, or an open circuit. For example, the first circuit 42 and/or the second circuit 43 may form a short circuit that includes a jumper element (low resistance value element) mounted on a substrate of the memory system 1. On the one hand, the first circuit 42 and/or the second circuit 43 may form an open circuit that omits the jumper element.

A setting signal supplied from the setting circuit 41 may include a 1-bit logic signal represented by, for example, an "H" level or an "L" level. In a case of inputting an "H" level signal to the input/output terminal I/O, for example, the first circuit 42 and the second circuit 43 are respectively configured to a short circuit and an open circuit. As a result, a potential of the node ND becomes a power supply voltage ("H" level) and an "H" level signal is input to the input/output terminal I/O connected to the node ND.

On the other hand, in a case of inputting an "L" level signal to the input/output terminal I/O, for example, the first circuit 42 and the second circuit 43 are respectively configured to an open circuit and a short circuit. As a result, a potential of the node ND becomes a ground voltage ("L" level) and an "L" level signal is input to the input/output terminal I/O connected to the node ND.

In the above description, the first circuit 42 and the second circuit 43 have been described as an open circuit or a short circuit. It should be noted that the present disclosure is not limited thereto. For example, by setting one circuit of the first circuit 42 and the second circuit 43 to high resistance and the other circuit to low resistance, it is possible to generate a 1-bit logic signal in a similar manner. Specifically, for example, an "H" level signal is input to the input/output terminal I/O in a case where a resistance value of the first circuit 42 is sufficiently lower than a resistance value of the second circuit 43. An "L" level signal is input to the input/output terminal I/O in a case where a resistance value of the first circuit 42 is sufficiently larger than a resistance value of the second circuit 43. The "H" level signal may correspond to a voltage above or equal to a threshold. The "L" level signal may correspond to a voltage less than or equal to a threshold.

1-2. Operation of Memory System 1

Figure 3:
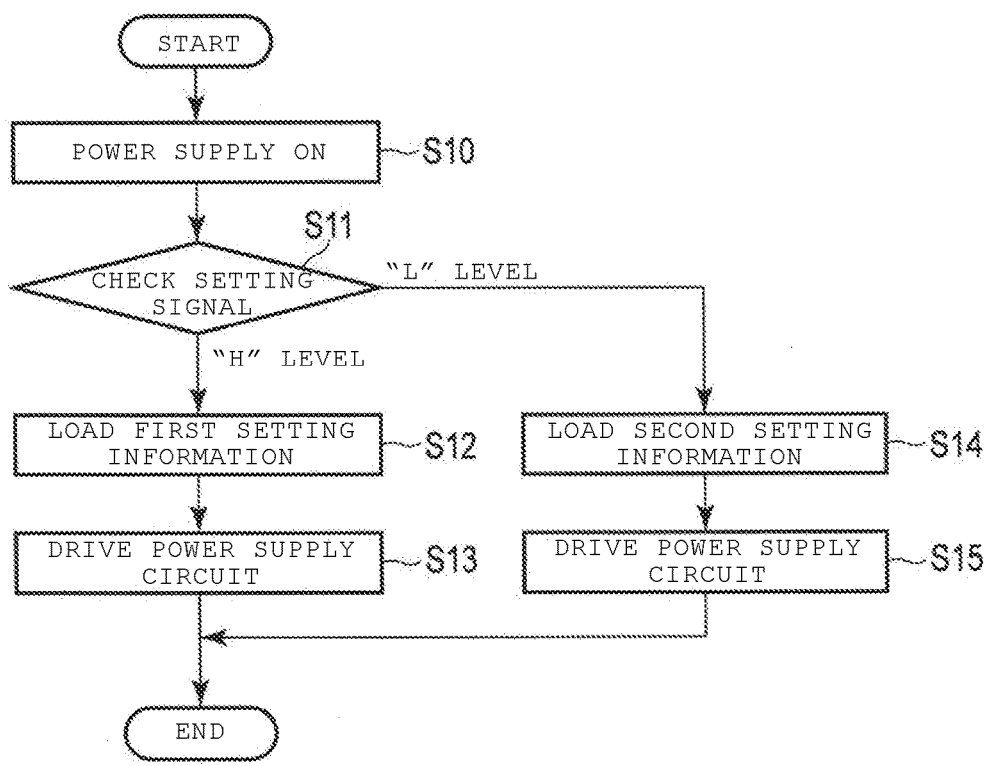
FIG. 3 is an operation flowchart of some embodiments of the power supply management device according to the first aspect.

Next, operation of the memory system 1 will be described. When a power supply is turned on by operation from the host equipment 2, the external power supply voltage Vin is supplied first to the power supply management device 30 and the setting unit 40 in the memory system 1. Then, based on a setting signal input to the input/output terminal I/O, the power supply management device 30 supplies an appropriate internal power supply voltage to at least one of the modules of the memory system 1 (e.g. to each of the modules of the memory system 1). Operation of the power supply management device 30 will be described in detail with reference to FIG. 3, FIG. 4A, and FIG. 4B. FIG. 3 illustrates an operation flowchart of the power supply management device 30 and FIG. 4A and FIG. 4B illustrate block diagrams corresponding to operation of the power supply management device 30 in a case where setting signals are respectively an "H" level and an "L" level.

As illustrated in FIG. 3, when power supply of the memory system 1 is turned on by operation from an external source (S10), the processor 32 of the power supply management device 30 first checks a setting signal input to the input/output terminal I/O (S11).

Figure 4A:
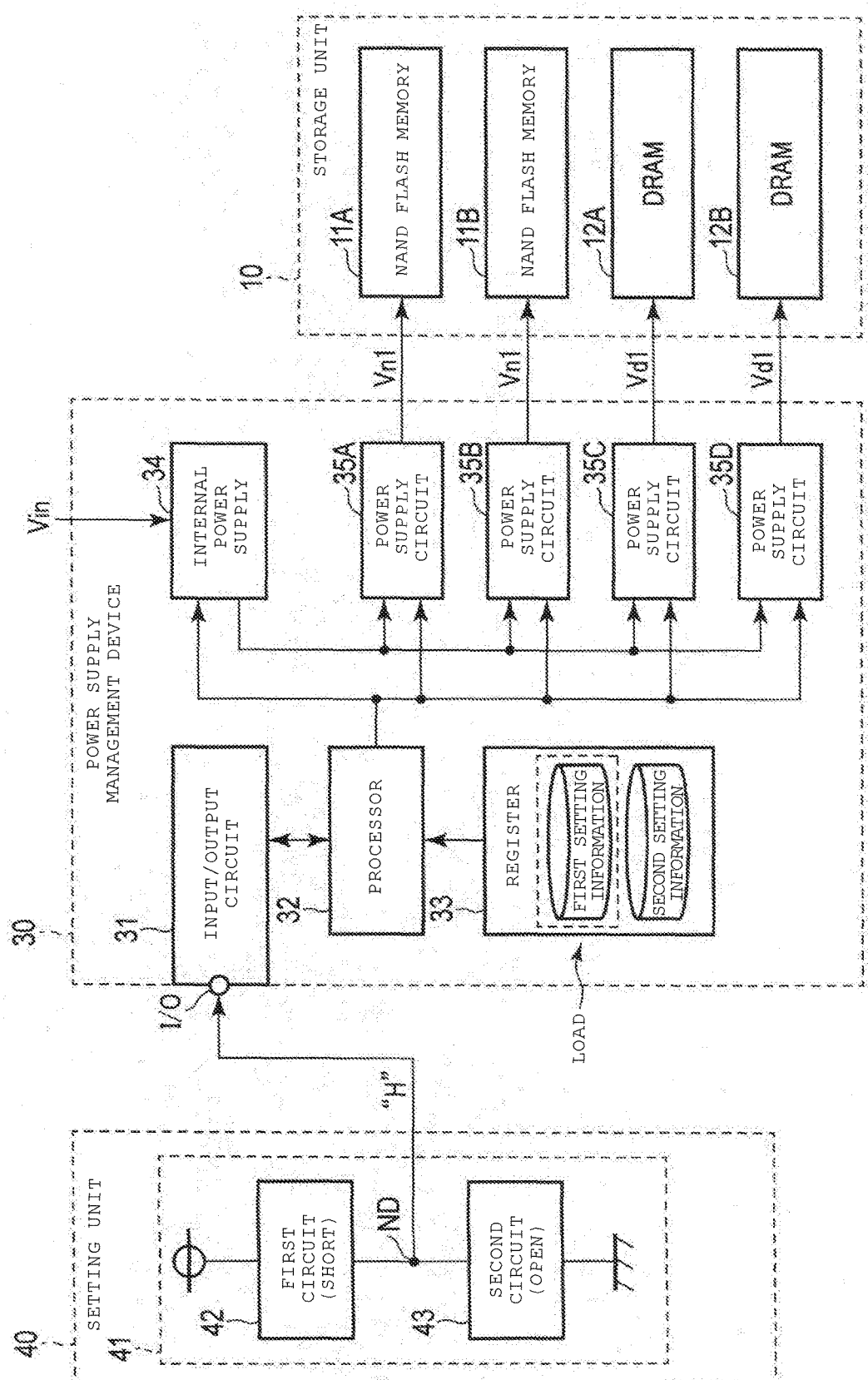
FIG. 4A is a block diagram illustrating some embodiments of a configuration of the power supply management device and the setting circuit according to the first aspect.

FIG. 4A illustrates a case where the setting unit 40 outputs a setting signal at an "H" level, in which, for example, the first circuit 42 functions as a short circuit and the second circuit 43 functions as an open circuit in the setting circuit 41. Based on, or responsive to, an "H" level signal being input to the input/output terminal I/O ("H" level in S11), the processor 32 loads the first setting information stored in the register 33 (S12) and controls the internal power supply 34 and the power supply circuit 35 based on the first setting information. The processor 32 causes the power supply circuits 35A and 35B to generate an internal power supply voltage Vn1 and to respectively supply the generated voltage to the NAND flash memories 11A and 11B. The processor 32 causes the power supply circuits 35C and 35D to generate an internal power supply voltage Vd1 and to respectively supply the generated voltage to the DRAMs 12A and 12B (S13). Then, each of the modules of the memory system 1 which receives voltage supply from the power supply management device 30 starts operation based on an instruction of the host equipment 2 or operation performed by the memory system 1.

Figure 4B:
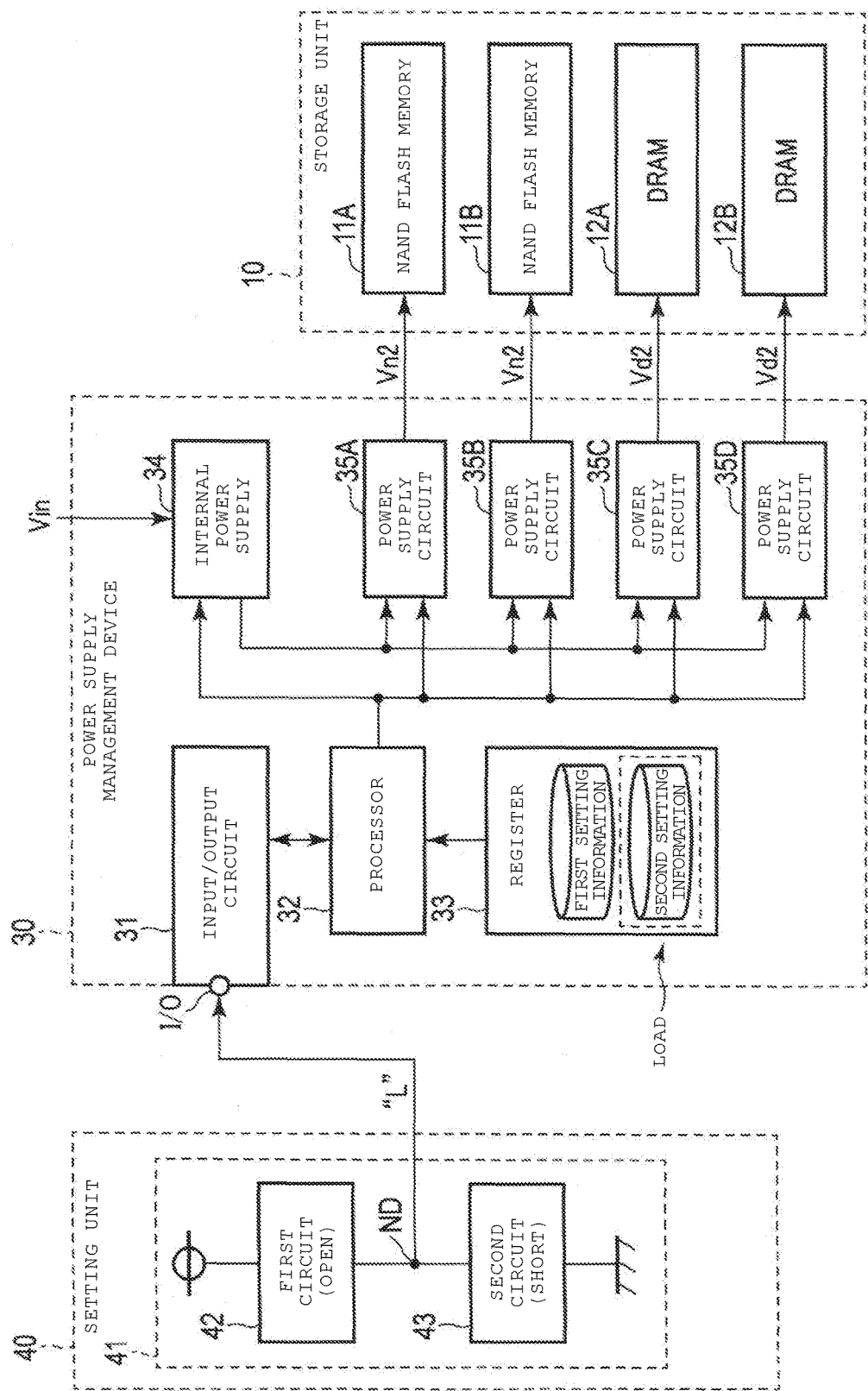
FIG. 4B is a block diagram illustrating some embodiments of a configuration of the power supply management device and the setting circuit according to the first aspect.

FIG. 4B illustrates a case where the setting unit 40 outputs a setting signal at an "L" level, in which, for example, the first circuit 42 functions as an open circuit and the second circuit 43 functions as a short circuit in the setting circuit 41. Based on, or responsive to, an "L" level signal being input to the input/output terminal I/O ("L" level in S11), the processor 32 loads second setting information stored in the register 33 (S14) and controls the internal power supply 34 and the power supply circuit 35 based on the second setting information. The processor 32 causes the power supply circuits 35A and 35B to generate an internal power supply voltage Vn2 different from the internal power supply voltage Vn1 and to respectively supply the generated voltage to the NAND flash memories 11A and 11B. The processor 32 causes the power supply circuits 35C and 35D to generate an internal power supply voltage Vd2 different from the internal power supply voltage Vd1 and to respectively supply the generated voltage to the DRAMs 12A and 12B (S15). Then, each of the modules of the memory system 1 which receives supply of an internal power supply voltage from the power supply management device 30 starts operation based on an instruction of the host equipment 2 or operation performed by the memory system 1.

In the above description, the internal power supply voltages Vn1 and Vn2 correspond to voltages (hereinafter, also referred to as "operation voltages") for operating NAND flash memories 11 of different specifications. The internal power supply voltages Vd1 and Vd2 correspond to operation voltages of DRAMs 12 having different specifications.

In addition, in the above description, a voltage value of each of the internal power supply voltages may be any one of, for example, Vn1=Vn2 and Vd1≠Vd2, and Vn1≠Vn2 and Vd1=Vd2. In some embodiments, Vn1, Vd1, Vn2 and Vd2 may have any appropriate voltage values, and any of Vn1, Vd1, Vn2 and Vd2 may have a same voltage value or different voltage value as any other of Vn1, Vd1, Vn2 and Vd2.

1-3. Advantages of Some Embodiments According to the First Aspect

The power supply management device 30 according to the first aspect, described above, provides for at least two power supply settings that can be implemented without changing a configuration of the power supply management device 30 itself or changing the setting information stored in the register 33. Hereinafter, some advantages of some embodiments according to the first aspect will be described in detail.

Figure 5:
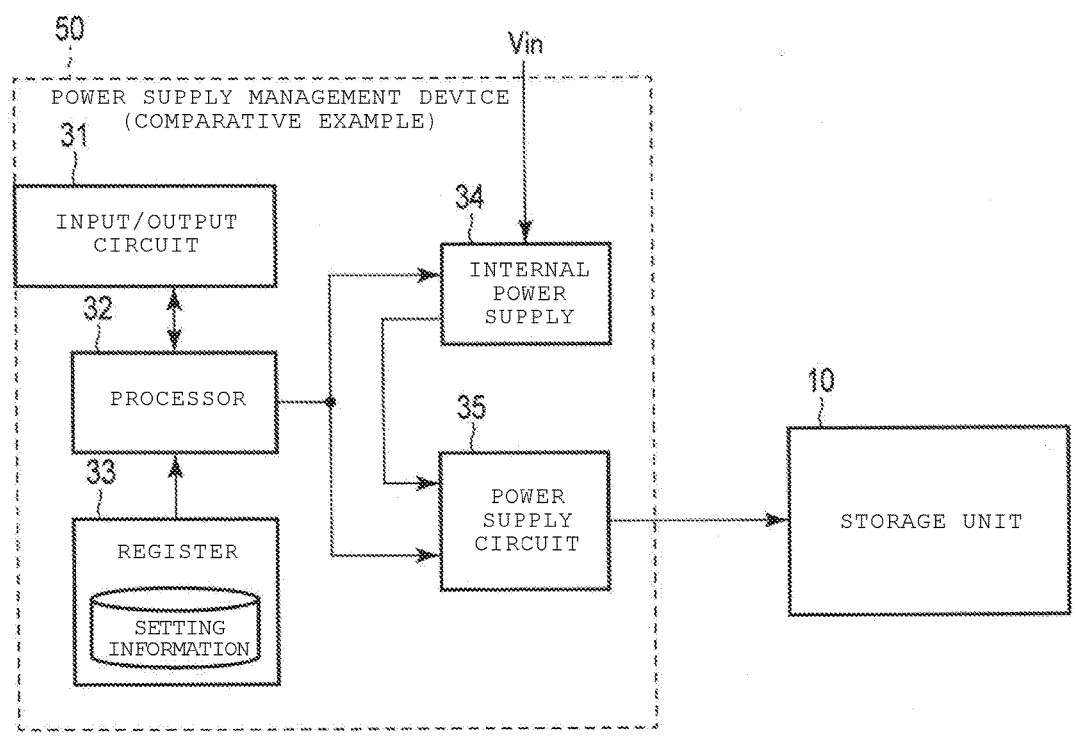
FIG. 5 is a block diagram representing a power supply management device according to a comparative example.

A module such as a semiconductor memory or the like used for the memory system 1 can have various specifications. For example, a NAND flash memory and a DRAM have different circuit configurations, so that operation voltages of the NAND flash memory and the DRAM may be different each other. Further, even for the same NAND flash memory or the same DRAM, the operation voltages may be different depending on a manufacture, a calibration, an initial configuration, a device structure, or a design generation of a product that incorporates the memory. In some comparative memory systems, a power supply management device is used so as to supply appropriate voltages to modules having different specifications. FIG. 5 is a block diagram of a power supply management device 50 according to a comparative example, and illustrates the power supply management device 50 while omitting details of the power supply circuit 35 and the corresponding storage unit 10.

In the comparative power supply management device 50 illustrated in FIG. 5, as compared with the power supply management device 30 described with reference to FIG. 2, a setting signal is not input to the input/output circuit 31 and the register 33 stores one type of setting information. When power is supplied to the memory system 1, the power supply management device 50 controls the internal power supply 34 and the power supply circuit 35 based on one type of setting information stored in the register 33 by the processor 32. In addition, different power supply settings are applied to the power supply management device 50 by rewriting setting information stored in the register 33 and changing a configuration of the power supply management device 50. However, this configuration involves a user preparing a different configuration of the power supply management device 50 for each product specification of the memory system (e.g. may involve the user rewriting the setting information multiple times).

In some embodiments of the power supply management device 30 according to the first aspect, the register 33 stores at least two types of setting information (first setting information and second setting information) and the processor 32 controls the internal power supply 34 and the power supply circuit 35 based on a setting signal input to the input/output terminal I/O. For example, in a case where the input setting signal is at an "H" level signal, the processor 32 controls the internal power supply 34 and the power supply circuit 35 based on the first setting information stored in the register 33. On the other hand, in a case where the input setting signal is at an "L" level signal, the processor 32 controls the internal power supply 34 and the power supply circuit 35 based on the second setting information stored in the register 33.

In this way, in some embodiments of the power supply management device 30 according to the first aspect, up to two power supply settings can be implemented without changing a configuration of the power supply management device 30 itself or setting information stored in the register 33. In other embodiments according to the first aspect, more than two power supply settings can be implemented. Therefore, since some embodiments of the power supply management device 30 according to the first aspect can implement a single power supply management device 30 for memory systems having different specifications, it is possible to provide for a reduced development cost of the power supply management device 30.

In addition, in some embodiments of the memory system 1 according to the first aspect, the setting unit 40 generates a setting signal to be input to the input/output terminal I/O of the power supply management device 30. Since the setting circuit 41 which constitutes the setting unit 40 can be used as long as the setting circuit 41 generates an "H" level signal or an "L" level signal, a simple circuit can form the setting circuit 41. That is, by outputting a desired setting signal by circuit design of the setting unit 40 and changing a power supply setting by changing design of the power supply management device 30 itself, a circuit design of the setting unit 40 can be simplified and/or made to be more readily manufactured.

Some embodiments of the memory system 1 according to the first aspect can include one or more circuits that are readily changed to change a power supply setting of the power supply management device 30. Therefore, some embodiments of the memory system 1 according to the first aspect can provide for a short development period and can provide for a reduced substrate development cost in a product development of the memory system 1.

2. Second Aspect

Next, some embodiments of the memory system 1 according to a second aspect will be described. In some embodiments of the memory system 1 according to the second aspect, the power supply management device 30 stores more setting information than that of some embodiments according to the first aspect and is operated by power supply settings associated with more setting signals. Hereinafter, differences of some embodiments of the memory system 1 according to the second aspect from some embodiments according to the first aspect will be described.

2-1. Configuration of Memory System 1

Figure 6:
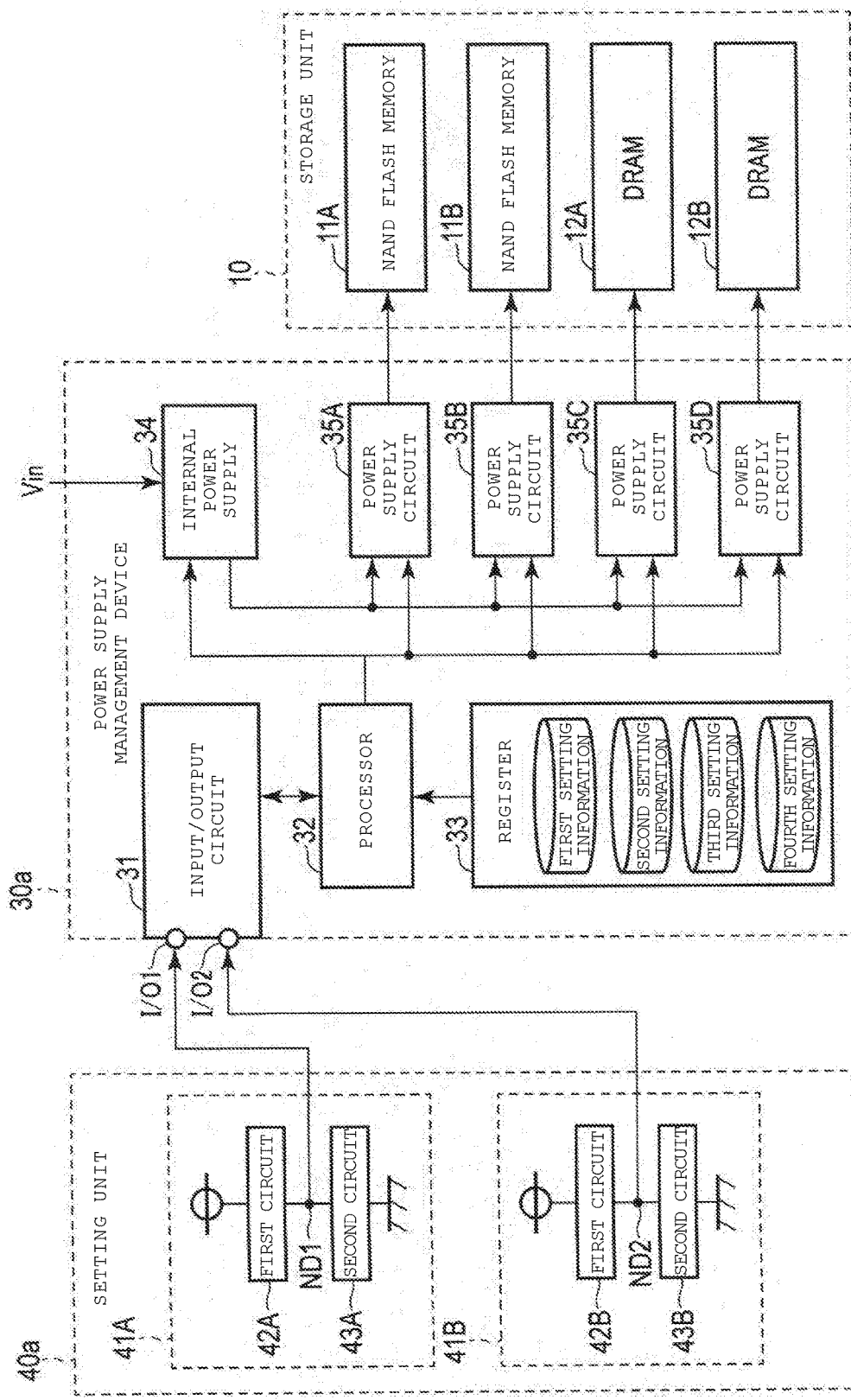
FIG. 6 is a block diagram of some embodiments of a power supply management device and a setting circuit according to a second aspect.

First, a configuration of some embodiments of the memory system 1 according to the second aspect will be described. In some embodiments of the memory system 1 according to the second aspect, a power supply management device 30a and a setting unit 40a have different configurations as compared with some embodiments of the memory system 1 according to the first aspect described with reference to FIG. 1. A configuration of the power supply management device 30a and the setting unit 40a according to some embodiments according to the second aspect will be described with reference to FIG. 6. FIG. 6 illustrates a block diagram of the power supply management device 30a and the setting unit 40a.

As illustrated in FIG. 6, some embodiments of the power supply management device 30a according to the second aspect stores first, second, third, and fourth setting information in the register 33. In the power supply management device 30a according to some embodiments according to the second aspect, at least two input/output terminals I/O1 and I/O2 provided in the input/output circuit 31 are configured to receive a setting signal.

In addition, some embodiments of the setting unit 40a according to the second aspect includes setting circuits 41A and 41B. A node ND1 of the setting circuit 41A is connected to the input/output terminal I/O1 and a node ND3 of the setting circuit 41B is connected to the input/output terminal I/O2. Other features of the power supply management device 30a and the setting unit 40a can have a same or similar configuration as those of the power supply management device 30 and the setting unit 40 of some embodiments according to the first aspect described with reference to FIG. 2, and description thereof will be omitted.

As described above, the setting signal in some embodiments of the power supply management device 30a according to the second aspect is a 2-bit signal based on a combination of signals input to the input/output terminals I/O1 and I/O2. In the following description, a case where signals input to the input/output terminals I/O1 and I/O2 are respectively at an "L" level and an "L" level is referred to as a setting signal "00", a case where the signals are respectively at an "L" level and an "H" level is referred to as a setting signal "01", a case where the signals are respectively at an "H" level and an "L" level is referred to as a setting signal "10", and a case where the signals are respectively at an "H" level and an "H" level is referred to as a setting signal "11".

2-2. Advantages of Some Embodiments According to the Second Aspect

According to some embodiments of the power supply management device 30a according to the second aspect described above, up to four different power supply settings can be implemented without changing a configuration of the power supply management device 30a itself or setting information stored in the register 33. In other embodiments, more than four different power supply settings can be implemented. Hereinafter, some advantages of some embodiments according to the second aspect will be described in detail.

As a setting signal, a 2-bit signal is input to the power supply management device 30a in accordance with some embodiments according to the second aspect. The power supply management device 30a can respectively assign different setting information to the input 2-bit setting signals. For example, in a case where the power supply management device 30a corresponds to a combination of the A type and B type NAND flash memories 11 having different operation voltages and the A type and B type DRAMs 12 having different operation voltages, the power supply management device 30a can assign setting information as illustrated in FIG. 7 to the 2-bit setting signals. FIG. 7 illustrates a table showing an example of the first, second, third, and fourth setting information in the power supply management device 30a.

As illustrated in FIG. 7, the first, second, third, and fourth setting information are respectively assigned to control signals "00", "01", "10", and "11". Then, the first setting information is a power supply setting corresponding to the A type NAND flash memory 11 and the A type DRAM 12, the second setting information is a power supply setting corresponding to the A type NAND flash memory 11 and the B type DRAM 12, the third setting information is a power supply setting corresponding to the B type NAND flash memory 11 and the A type DRAM 12, and the fourth setting information is a power supply setting corresponding to the B type NAND flash memory 11 and the B type DRAM 12.

In this way, based on the input 2-bit setting information, the power supply management device 30a can implement at least four power supply settings. Therefore, since the common power supply management device 30a can be used for more memory systems than would be the case for some embodiments according to the first aspect, the power supply management device 30a provide for a reduced development cost of the power supply management device 30a.

In addition, some embodiments of the memory system 1 according to the second aspect can include one or more circuits that are readily changed to change a power supply setting of the power supply management device 30a. Therefore, the memory system 1 according to the embodiment can provide for a short product development period and can provide for a reduced substrate development cost in a product development of the memory system in a manner similar to that described above for some embodiments according to the first aspect.

In some embodiments of the memory system 1 according to the second aspect, the NAND flash memories 11 having different specifications from each other may be implemented, and/or the DRAMs 12 having different specifications from each other may be implemented.

In addition, for some embodiments according to the second aspect, an example has been described in which the power supply management device 30a selects setting information based on a 2-bit setting signal. It should be noted that the present disclosure is not limited thereto. For example, based on a setting signal of 3 or more bits, the power supply management device 30a may select setting information. In this case, of a plurality of input/output terminals provided in the input/output circuit 31, some of the input/output terminals corresponding to the number of input setting signals are used for an input of the setting signals. At this time, the setting circuit 41 may be provided in accordance with some of the input/output terminals used for the input of the setting signals. In this way, based on a setting signal of 3 or more bits, the power supply management device 30a can implement more power supply settings than would be the case in an implementation that uses a 2-bit setting signal.

3. Third Aspect

Next, some embodiments of the memory system 1 according to a third aspect will be described. In some embodiments of the memory system 1 according to the third aspect, the setting circuit 41 is configured with a resistor and the power supply management device 30 is operated by a power supply setting associated with a voltage value input to the input/output terminal. Hereinafter, differences of some embodiments of the memory system 1 according to the third aspect from some embodiments according to the first aspect will be described.

3-1. Configuration of Memory System 1

Figure 8:
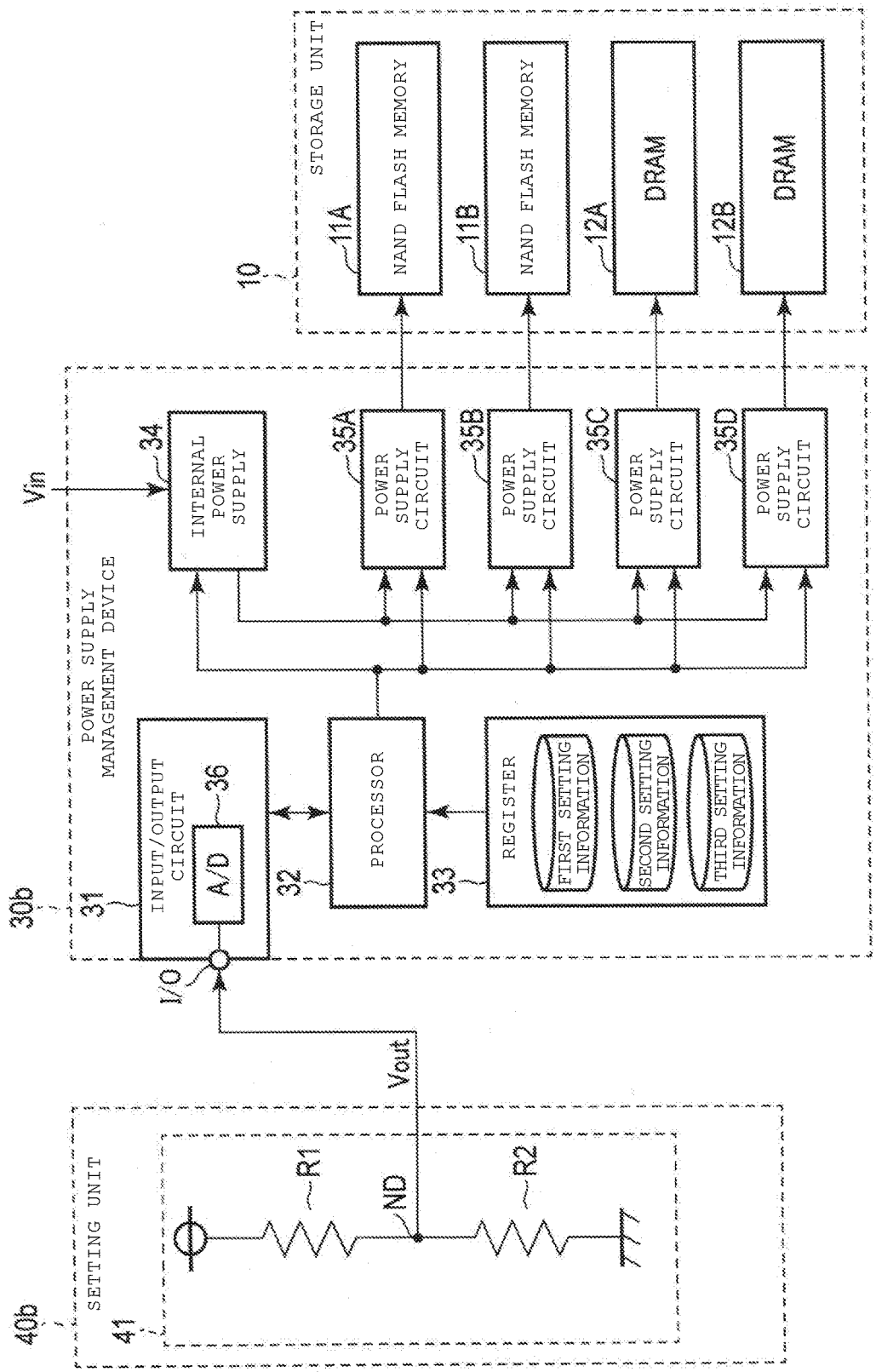
FIG. 8 is a block diagram of some embodiments of a power supply management device and a setting circuit according to a third aspect.

First, some embodiments of a configuration of the memory system 1 according to the third aspect will be described. In some embodiments of the memory system 1 according to the third aspect, the power supply management device 30 and the setting unit 40 have different configurations as compared with some embodiments of the memory system 1 according to the first aspect described with reference to FIG. 1. A configuration of a power supply management device 30b and a setting unit 40b in accordance with some embodiments according to the third aspect will be described with reference to FIG. 8. FIG. 8 illustrates a block diagram of the power supply management device 30b and the setting unit 40b.

As illustrated in FIG. 8, some embodiments of the power supply management device 30b according to the third aspect stores first, second, and third setting information in the register 33. Some embodiments of the input/output circuit 31 of the power supply management device 30b according to the third aspect include an A/D converter 36 connected to the input/output terminal I/O. The A/D converter 36 converts a voltage input to the input/output terminal I/O into a digital value having a plurality of bits. In some embodiments according to the third aspect, the first, second, and third setting information is assigned based on the converted digital value having the plurality of bits.

In addition, in some embodiments of the setting unit 40b according to the third aspect, the setting circuit 41 is configured with a resistor. Specifically, in the setting circuit 41 according to the embodiments illustrated in FIG. 8 as compared with the setting circuit 41 of some embodiments according to the first aspect described with reference to FIG. 2, the first circuit 42 is replaced with a resistor R1 and the second circuit 43 is replaced with a resistor R2. An output voltage Vout based on resistance values of the resistor R1 and the resistor R2 is input to the input/output terminal I/O. Other features of the power supply management device 30b and the setting unit 40b have a same or similar configuration as those of some embodiments of the power supply management device 30 and the setting unit 40 according to the first aspect described with reference to FIG. 2, and description thereof will be omitted.

3-2. Advantages of Some Embodiments According to the Third Aspect

According to some embodiments of the power supply management device 30b according to the third aspect described above, at least three power supply settings can be implemented without changing a configuration of the power supply management device 30b itself or setting information stored in the register 33. Hereinafter, some advantages of some embodiments according to the third aspect will be described in detail.

The A/D converter 36 converts a voltage input to the input/output terminal I/O into a digital value in some embodiments of the power supply management device 30b according to the third aspect. For example, FIG. 9 is a table showing some example cases where a power supply voltage is 10 V and resistors of 1 kΩ or 3 kΩ are used as the resistors R1 and R2. FIG. 9 illustrates some examples of the output voltage Vout of the setting circuit 41 in accordance with different resistor values for resistors R1 and R2.

As illustrated in FIG. 9, in a case where the resistors R1 and R2 are respectively about 3 kΩ and about 1 kΩ, the output voltage Vout is about 0.25 V. In a case where the resistors R1 and R2 are each about 1 kΩ or about 3 kΩ, the output voltage Vout is about 0.5 V. In a case where the resistors R1 and R2 are respectively about 1 kΩ and about 3 kΩ, the output voltage Vout is about 0.75 V. Then, the A/D converter 36 executes A/D conversion of voltages of about 0.25 V, about 0.5 V, and about 0.75 V input to the input/output terminal I/O. The processor 32 selects one of the first, second, and third setting information with reference to the classified digital values and controls the internal power supply 34 and the power supply circuit 35.

In this way, some embodiments of the power supply management device 30b according to the third aspect can implement three or more types of power supply settings in accordance with the input voltage value. Therefore, since the common power supply management device 30b can be used for more memory systems than is the case for some embodiments according to the first aspect, some embodiments of the power supply management device 30b according to the third aspect can provide for a reduced development cost of the power supply management device 30b.

In addition, some embodiments of the memory system 1 according to the third aspect can include one or more circuits that are readily changed to change a power supply setting of the power supply management device 30b, in a manner similar to that described above for some embodiments according to the first aspect. Therefore, some embodiments of the memory system 1 according to the third aspect can provide for a short product development period and can provide for a reduced substrate development cost in a product development of the memory system in a same or similar manner as for some embodiments according to the first aspect.

Thus some embodiments of the power supply management device 30b according to the third aspect select a setting signal based on one of three different of voltages. It should be noted that the present disclosure is not limited thereto. For example, based on voltages of four or more bits, the power supply management device 30b may select setting information. In this case, the power supply management device 30b can implement power supply settings of four or more bits based on a voltage value input to one input/output terminal I/O.

4. Fourth Aspect

Next, some embodiments of the memory system 1 according to a fourth aspect will be described. In some embodiments of the memory system 1 according to the fourth aspect as compared with setting information of the power supply management device 30 described in some embodiments of the memory system 1 according to the first, second, and third aspects, a setting related to a communication interface is added. Hereinafter, differences of some embodiments of the memory system 1 according to the fourth aspect from some embodiments according to the first aspect will be described.

4-1. Configuration of Memory System 1

Figure 10:
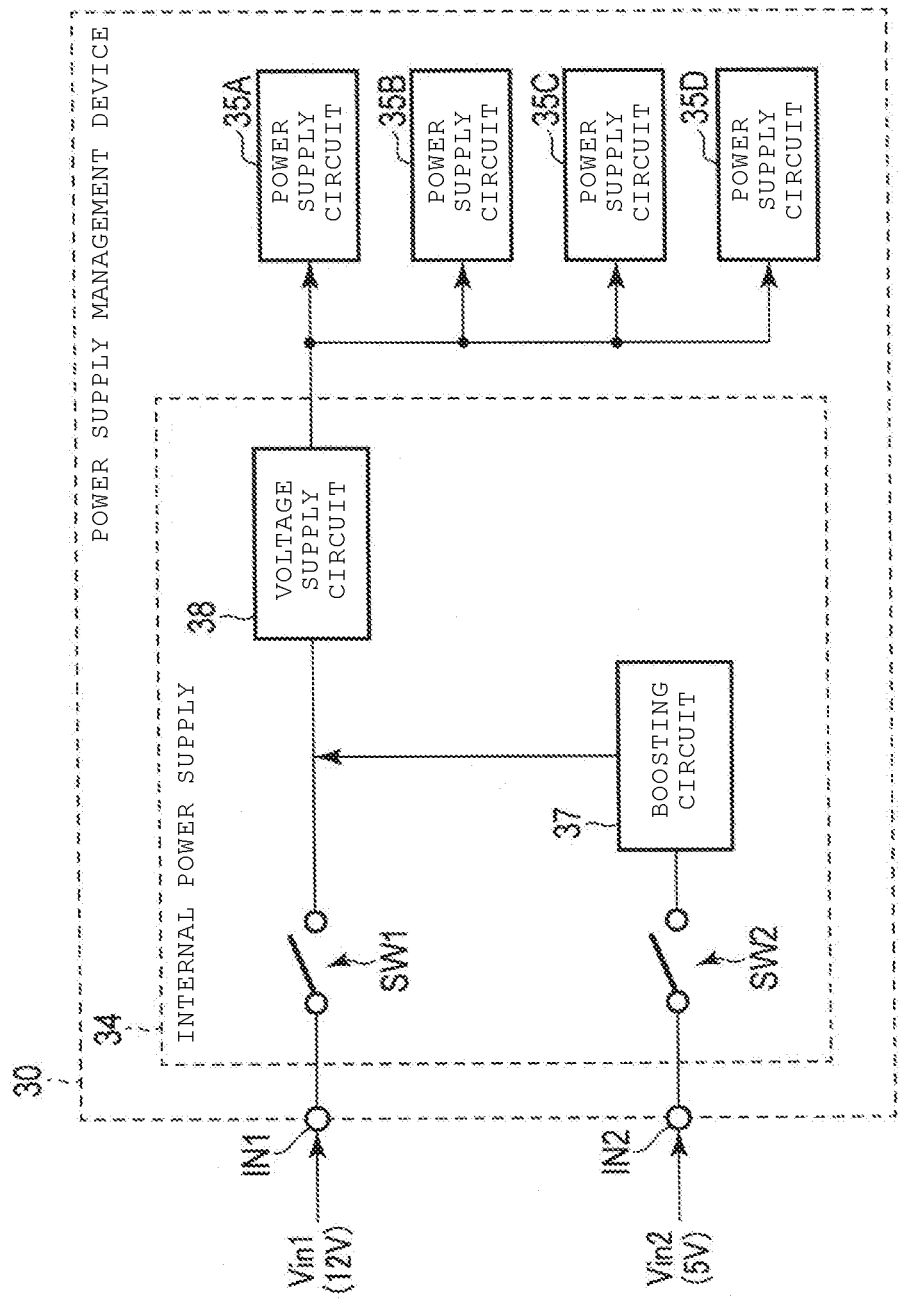
FIG. 10 is a block diagram of some embodiments of an internal power supply provided in a power supply management device according to a fourth aspect.

First, a configuration of some embodiments of the power supply management device 30 will be described with reference to FIG. 10. FIG. 10 illustrates a circuit configuration of the internal power supply 34 provided in the power supply management device 30. An external power supply voltage Vin1 is input to a first power supply terminal IN1 of the power supply management device 30 and an external power supply voltage Vin2 lower than the external power supply voltage Vin1 is input to a second power supply terminal IN2 of the power supply management device 30.

As illustrated in FIG. 10, the internal power supply 34 includes a first switch element SW1, a second switch element SW2, a boosting circuit 37, and a voltage supply circuit 38.

The first switch element SW1 and the second switch element SW2 are controlled by the processor 32 and selectively and electrically connect or disconnect a first end and a second end of the first switch element SW1 and the second switch element SW2, respectively. The first end of the first switch element SW1 is connected to the first power supply terminal IN1 and the second end of the first switch element SW1 is connected to the voltage supply circuit 38. The first end of the second switch element SW2 is connected to the second power supply terminal IN2 and the second end of the second switch element SW2 is connected to the boosting circuit 37.

The boosting circuit 37 is a circuit which boosts the external power supply voltage Vin2 input to the second power supply terminal IN2 to the external power supply voltage Vin1 input to the first power supply terminal IN1 and inputs the boosted external power supply voltage Vin2 to the voltage supply circuit 38. For example, the boosting circuit 37 boosts a voltage of about 5 V input to the second power supply terminal IN2 illustrated in FIG. 10 to a voltage of about 12 V input to the first power supply terminal IN1. A circuit configuration of the boosting circuit 37 can use any appropriate configuration.

One of a voltage input to the first power supply terminal IN1 or a voltage input to the second power supply terminal IN2 and boosted by the boosting circuit 37 is input to the voltage supply circuit 38. Then, the voltage supply circuit 38 supplies the input voltage to, for example, at least one of the power supply circuits 35A, 35B, 35C, and 35D.

4-2. Operation of Memory System 1

Next, operation of some embodiments of the memory system 1 according to the fourth aspect will be described. The memory system 1 has different specifications of input power supply (for example, voltage standard values) according to a communication interface to be used, specifications of the host equipment 2, and the like. For example, an input power supply for Serial Attached SCSI (SAS) is about 12 V/about 5 V and input power supply for PCIe is about 12 V. An example of operation in a case where a communication interface applied to the memory system 1 is Serial Attached SCSI (SAS) or PCIe will be described with reference to FIG. 10 and FIG. 11. FIG. illustrates a table showing an example of setting information of the power supply management device 30. As illustrated in FIG. 11, the first setting information corresponds to SAS and the second setting information corresponds to PCIe.

For example, as illustrated in FIG. 10, in a case where an interface applied to the memory system 1 is SAS, a voltage of about 12 V is input to the first power supply terminal IN1 and a voltage of about 5 V is input to the second power supply terminal IN2. When power is supplied to the memory system 1 and the power supply management device 30 is operated based on the first setting information, the processor 32 causes the first switch element SW1 and the second switch element SW2 to be in an on state as illustrated in FIG. 11. In this way, a voltage of about 12 V input to the first power supply terminal IN1 is input to the voltage supply circuit 38 and a voltage of about 5 V input to the second power supply terminal IN2 is boosted to about 12 V via the boosting circuit 37 and is input to the voltage supply circuit 38.

On the other hand, for example, as illustrated in FIG. 10, in a case where an interface applied to the memory system 1 is PCIe, a voltage of about 12 V is input to the first power supply terminal IN1 and substantially no voltage is input to the second power supply terminal IN2. When power is supplied to the memory system 1 and the power supply management device 30 is operated based on the second setting information, the processor 32 respectively causes the first switch element SW1 and the second switch element SW2 to be an on state and an off state as illustrated in FIG. 11. In this way, a voltage of about 12 V input to the first power supply terminal IN1 is input to the voltage supply circuit 38.

4-3. Advantages of some Embodiment According to the Fourth Aspect

As described above, some embodiments of the power supply management device 30 according to the fourth aspect can apply an input voltage setting for each of communication interfaces based on setting information. Therefore, by combining some features of embodiments according to the first, second, and third aspects, some embodiments of the memory system 1 according to the fourth aspect can correspond to different specifications of input power supply without changing a configuration of the power supply management device 30 itself or setting information stored in the register 33.

For some embodiments according to the fourth aspect, a case has been described in which SAS and PCIe are used as communication interfaces used for the memory system 1. It should be noted that the present disclosure is not limited thereto. For example, some embodiments according to the fourth aspect can be applied to other communication interfaces such as Serial Advanced Technology Attachment (SATA) and Universal Serial Bus (USB).

In addition, for some embodiments according to the fourth aspect, a case has been described in which a voltage of about 12 V and a voltage of about 5 V are respectively input to the first power supply terminal IN1 and the second power supply terminal IN2. It should be noted that the present disclosure is not limited thereto. An external power supply voltage input to each of power supply terminals can be changed based on a standard of a communication interface. For example, in a case of SATA, power supply of about 5 V or power supply of about 3.3 V is connected to each of power supply terminals.

In addition, for some embodiments according to the fourth aspect, a case has been described in which an external power supply voltage input to the first power supply terminal IN1 is larger than an external power supply voltage input to the second power supply terminal IN2. It should be noted that the present disclosure is not limited thereto. For example, as illustrated in FIG. 12, a voltage of about 5 V may be input to the first power supply terminal IN1 and a voltage of about 12 V may be input to the second power supply terminal IN2.

Figure 12:
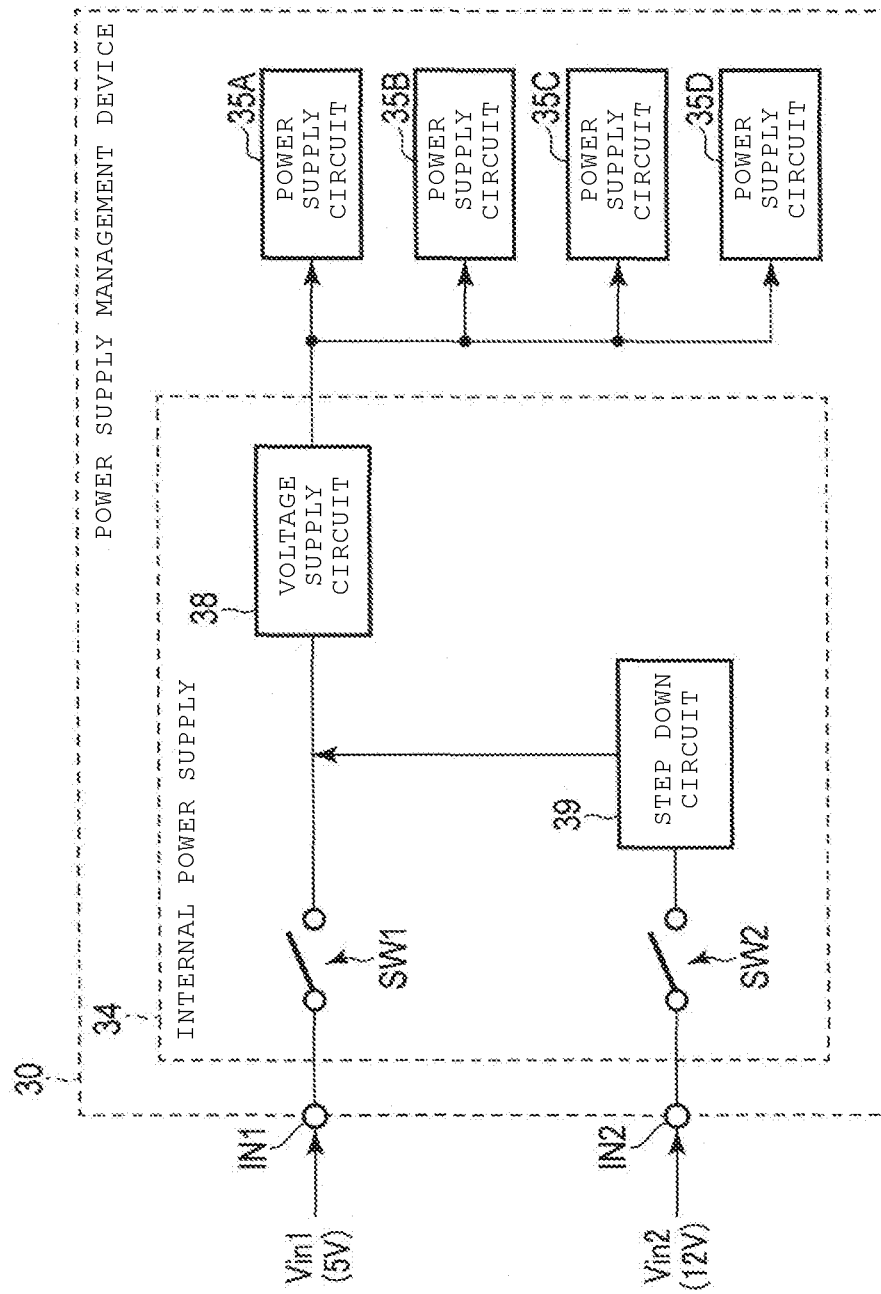
FIG. 12 is a block diagram of internal power supply provided in a power supply management device according to a modification example of the fourth aspect.

In the example embodiments shown in FIG. 12, a step down circuit 39 instead of the boosting circuit 37 illustrated in FIG. 10 is provided in the internal power supply 34. The step down circuit 39 is a circuit which steps down an external power supply voltage input to the second power supply terminal IN2 to an external power supply voltage input to the first power supply terminal IN1 and inputs the external power supply voltage to the voltage supply circuit 38. For example, the step down circuit 39 steps down a voltage of about 12 V input to the second power supply terminal IN2 to a voltage of about 5V input to the first power supply terminal IN1. In this way, for example, a voltage of about 5 V input to the first power supply terminal IN1 and a voltage of about 5 V input to the second power supply terminal IN2 and stepped down by the step down circuit 39 are input to the voltage supply circuit 38. The voltage supply circuit 38 supplies the input voltages to the power supply circuits 35A, 35B, 35C, and 35D.

Further, for some embodiments according to the fourth aspect, an example has been described in which there are two power supply terminals. It should be noted that the present disclosure is not limited thereto. For example, the memory system 1 maybe connected to three or more power supplies. In such a case, the power supply management device 30 can generate a desired voltage by boosting and stepping down the input external power supply voltage by the internal power supply 34.

5. Modification Example

The power supply management device 30 of some embodiments of a modification example includes a first input terminal (e.g. the I/O shown in FIG. 2) and a first power supply circuit (e.g. the power supply circuit 35 shown in FIG. 2) which outputs a voltage obtained by converting an input voltage. After power is supplied to the power supply management device, in a case where a first signal (e.g. the "H" level shown in FIG. 3) is input to the first input terminal, the first power supply circuit outputs a first voltage (e.g. as shown in FIG. 4A) and in a case where a second signal (e.g. the "L" level shown in FIG. 3) different from the first signal is input to the first input terminal, the first power supply circuit outputs a second voltage different from the first voltage (e.g. as shown in FIG. 4B).

In addition, the memory system 1 of some modification examples include a storage unit (e.g. the storage unit 10 shown in FIG. 1) having a first memory, a controller (e.g. the controller 20 shown in FIG. 1) which controls the storage unit, the power supply management device (e.g. the power supply management device 30 shown in FIG. 1) having the first input terminal and the first power supply circuit which converts an input voltage and supplies the voltage to the first memory, and a setting unit (e.g. the setting unit 40 shown in FIG. 1) which inputs a setting signal to the first input terminal. When power is supplied to the memory system 1, in a case where the setting signal is the first signal, the first power supply circuit outputs the first voltage and in a case where the setting signal is the second signal, the first power supply circuit outputs the second voltage.

In this way, there are provided the power supply management device capable of using a plurality of power supply settings without changing a device configuration and the memory system including the power supply management device.

In the embodiments described herein, cases have been described in which the power supply management device 30 is used for a memory system such as an SSD. It should be noted that the present disclosure is not limited thereto. For example, the power supply management device 30 described in embodiments described herein can be used for other storage products such as a hard disk drive (HDD), a USB connection storage device, an optical disc, an optical-magnetic disc, and the like. In addition, the power supply management device 30 described in the embodiments described herein can be used for any devices which are operated based on external power supply. For example, the power supply management device 30 can be incorporated in an in-vehicle device which is operated by a battery, which is an example of DC power supply, or an electronic device (for example, television, personal computer, or the like) which is operated by a DC power supply converted from an AC power supply.

Further, the configuration of the power supply management device 30 described in the embodiments described herein is not limited thereto. For example, the processor 32 may be not provided in the power supply management device 30. In this case, the power supply management device 30 can be provided with a dedicated circuit (for example, a circuit which reads one piece of setting information in the register 33 and sets the setting information to the power supply circuit 35 based on information from the input/output circuit 31) which forms a process executed by the processor 32. Any other method that can perform the operations described in the embodiment described herein by hardware and/or software, or a combination of both may be implemented.

Each of components of the power supply management device 30 in the above embodiment may be formed on, for example, one chip. That is, the power supply management device 30 is provided with, for example, the input/output circuit 31, the processor 32, the register 33, the internal power supply 34, and the power supply circuit 35 on one semiconductor chip.

Further, in the present specification, the term "connection" means electrically connected, for example, and does not exclude implementations in which another element is interposed therebetween. In this specification, the term "dis-connection" means that a switch is in an off state, and does not exclude the possibility that a small current such as a leak current of a transistor flows.

As used herein, the terms "about," "approximately," and "substantially" are used to describe and account for small variations. When used in conjunction with an event or circumstance, the terms "about," "approximately," and "substantially" can refer to instances in which the event or circumstance occurs precisely as well as instances in which the event or circumstance occurs to a close approximation. For example, when used in conjunction with a numerical value, the terms "about," "approximately," and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described herein, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure, and various embodiments and aspects maybe combined. The accompanying claims and their equivalents are intended to cover such forms or modifications as would fall within the scope and spirit of the present disclosure.

What is claimed is:

1. A power supply management device comprising:
an input circuit configured to receive a first voltage and to output a voltage corresponding to the first voltage;
a first input terminal configured to receive a signal different from the first voltage; and
a first power supply circuit configured to receive the voltage corresponding to the first voltage from the input circuit, and to output a voltage obtained by converting the voltage corresponding to the first voltage,
wherein the first power supply circuit is further configured to output a second voltage responsive to a first signal being received by the first input terminal, and to output a third voltage different from the second voltage responsive to a second signal different from the first signal being received by the first input terminal.

2. The power supply management device according to claim 1, further comprising:
a register circuit configured to store first setting information and second setting information,
wherein the first power supply circuit is configured to operate based on the first setting information responsive to the first signal being received by the first input terminal, and is configured to operate based on the second setting information responsive to the second signal being received by the first input terminal.

3. The power supply management device according to claim 2,
wherein the first signal is a signal of a first logic level and the second signal is a signal of a second logic level different from the first logic level.

4. The power supply management device according to claim 2,
wherein the register circuit is further configured to store third setting information, and
the first power supply circuit is configured to operate based on the third setting information responsive to a third signal different from the first signal and the second signal being received by the first input terminal.

5. The power supply management device according to claim 1, further comprising:
a second input terminal configured to receive a signal different from the first voltage; and
a second power supply circuit configured to receive the voltage corresponding to the first voltage from the input circuit, and to output a voltage obtained by converting the voltage corresponding to the first voltage,
wherein the second power supply circuit is further configured to:
output a fourth voltage responsive to the first signal being received by the first input terminal and a third signal different from the first signal and the second signal being received by the second input terminal,
output a fifth voltage different from the fourth voltage responsive to the second signal being received by the first input terminal and the third signal being received by the second input terminal,
output a sixth voltage different from the fourth voltage and the fifth voltage responsive to the first signal being received by the first input terminal and a fourth signal different from the first signal, the second signal, and the third signal being received by the second input terminal, and
output a seventh voltage different from the fourth voltage, the fifth voltage, and the sixth voltage responsive to the second signal being received by the first input terminal and the fourth signal being received by the second input terminal.

6. The power supply management device according to claim 5, further comprising:
a register circuit configured to store first setting information, second setting information, third setting information, and fourth setting information,
wherein the first power supply circuit and the second power supply circuit are configured to operate based on the first setting information responsive to the first signal being received by the first input terminal and the third signal being received by the second input terminal,
the first power supply circuit and the second power supply circuit are configured to operate based on the second setting information responsive to the second signal being received by the first input terminal and the third signal being received by the second input terminal,
the first power supply circuit and the second power supply circuit are configured to operate based on the third setting information responsive to the first signal being received by the first input terminal and the fourth signal being received by the second input terminal, and
the first power supply circuit and the second power supply circuit are configured to operate based on the fourth setting information responsive to the second signal being received by the first input terminal and the fourth signal being received by the second input terminal.

7. The power supply management device according to claim 6,
wherein the first signal is a signal of a first logic level and the second signal is a signal of a second logic level different from the first logic level, and
the third signal is a signal of a third logic level and the fourth signal is a signal of a fourth logic level different from the third logic level.

8. The power supply management device according to claim 6,
wherein the register circuit is further configured to store fifth setting information, sixth setting information, seventh setting information, eighth setting information, and ninth setting information, and
the first power supply circuit and the second power supply circuit are configured to operate based on the fifth setting information responsive to a fifth signal different from the first signal, the second signal, the third signal, and the fourth signal being received by the first input terminal and a sixth signal different from the first signal, the second signal, the third signal, the fourth signal, and the fifth signal being received by the second input terminal,
the first power supply circuit and the second power supply circuit are configured to operate based on the sixth setting information responsive to the fifth signal being received by the first input terminal and the third signal being received by the second input terminal,
the first power supply circuit and the second power supply circuit are configured to operate based on the seventh setting information responsive to the fifth signal being received by the first input terminal and the fourth signal being received by the second input terminal,
the first power supply circuit and the second power supply circuit are configured to operate based on the eighth setting information responsive to the first signal being received by the first input terminal and the sixth signal being received by the second input terminal, and
the first power supply circuit and the second power supply circuit are configured to operate based on the ninth setting information responsive to the second signal being received by the first input terminal and the sixth signal being received by the second input terminal.

9. The power supply management device according to claim 1,
wherein the power supply management device is a single integrated circuit, and the first input terminal is further configured to connect to a general purpose input/output (GPIO) circuit or an analog to digital (A/D) converter circuit.

10. A memory system comprising:
a storage unit which comprises a first memory;
a controller circuit configured to control the storage unit;
a power supply management device which comprises an input circuit configured to receive a first voltage and to output a voltage corresponding to the first voltage, a first input terminal configured to receive a signal different from the first voltage, and a first power supply circuit configured to receive the voltage corresponding to the first voltage from the input circuit, and to convert the voltage corresponding to the first voltage to output the converted voltage to the first memory or the controller circuit; and
a setting circuit configured to provide a setting signal to the first input terminal,
wherein the first power supply circuit is configured to output a second voltage responsive to the setting signal being a first signal and to output a third voltage responsive to the setting signal being a second signal.

11. The memory system according to claim 10,
wherein the power supply management device further comprises a register circuit configured to store first setting information and second setting information, and
the first power supply circuit is configured to operate based on the first setting information responsive to the first signal being received by the first input terminal, and is configured to operate based on the second setting information responsive to the second signal being received by the first input terminal.

12. The memory system according to claim 11, wherein the first signal is a signal of a first logic level and the second signal is a signal of a second logic level different from the first logic level.

13. The memory system according to claim 11, wherein the register circuit is further configured to store third setting information, and
the first power supply circuit is configured to operate based on the third setting information responsive to the setting signal being a third signal.

14. The memory system according to claim 10, wherein the storage unit further comprises a second memory,
the power supply management device further comprises a second input terminal configured to receive a signal different from the first voltage and a second power supply circuit configured to convert a voltage corresponding to the first voltage to output the converted voltage to the second memory, and the second power supply circuit is further configured to:
output a fourth voltage responsive to the first signal being received by the first input terminal and a third signal different from the first signal and the second signal being received by the second input terminal,
output a fifth voltage different from the fourth voltage responsive to the second signal being received by the first input terminal and the third signal being received by the second input terminal,
output a sixth voltage different from the fourth voltage and the fifth voltage responsive to the first signal being received by the first input terminal and a fourth signal different from the first signal, the second signal, and the third signal being received by the second input terminal, and
output a seventh voltage different from the fourth voltage, the fifth voltage, and the sixth voltage responsive to the second signal being received by the first input terminal and the fourth signal being received by the second input terminal.

15. The memory system according to claim 14, wherein the power supply management device further comprises a register circuit configured to store first setting information, second setting information, third setting information, and fourth setting information,
the first power supply circuit and the second power supply circuit are configured to operate based on the first setting information responsive to the first signal being received by the first input terminal and the third signal being received by the second input terminal,
the first power supply circuit and the second power supply circuit are configured to operate based on the second setting information responsive to the second signal being received by the first input terminal and the third signal being received by the second input terminal,
the first power supply circuit and the second power supply circuit are configured to operate based on the third setting information responsive to the first signal being received by the first input terminal and the fourth signal being received by the second input terminal, and
the first power supply circuit and the second power supply circuit are configured to operate based on the fourth setting information responsive to the second signal being received by the first input terminal and the fourth signal being received by the second input terminal.

16. The memory system according to claim 15, wherein the first signal is a signal of a first logic level and the second signal is a signal of a second logic level different from the first logic level, and
the third signal is a signal of a third logic level and the fourth signal is a signal of a fourth logic level different from the third logic level.

17. The memory system according to claim 15, wherein the register circuit is further configured to store fifth setting information, sixth setting information, seventh setting information, eighth setting information, and ninth setting information, and
the first power supply circuit and the second power supply circuit are configured to operate based on the fifth setting information responsive to a fifth signal different from the first signal, the second signal, the third signal, and the fourth signal being received by the first input terminal and a sixth signal different from the first signal, the second signal, the third signal, the fourth signal, and the fifth signal being received by the second input terminal,
the first power supply circuit and the second power supply circuit are configured to operate based on the sixth setting information responsive to the fifth signal being received by the first input terminal and the third signal being received by the second input terminal,
the first power supply circuit and the second power supply circuit are configured to operate based on the seventh setting information responsive to the fifth signal being received by the first input terminal and the fourth signal being received by the second input terminal,
the first power supply circuit and the second power supply circuit are configured to operate based on the eighth setting information responsive to the first signal being received by the first input terminal and the sixth signal being received by the second input terminal, and
the first power supply circuit and the second power supply circuit are configured to operate based on the ninth setting information responsive to the second signal being received by the first input terminal and the sixth signal being received by the second input terminal.

18. The memory system according to claim 10, wherein the power supply management device is a single integrated circuit, and the first input terminal is further configured to connect to a general purpose input/output (GPIO) circuit or an analog to digital (A/D) converter circuit.

19. The memory system according to claim 10, wherein the setting circuit comprises a first circuit and a second circuit,
a node of the setting circuit connected to the first input terminal is connected to a power supply via the first circuit and is connected to a ground via the second circuit, and
the setting signal is the first signal and a resistance value of the first circuit is smaller than a resistance value of the second circuit, or the setting signal is the second signal and a resistance value of the first circuit is larger than a resistance value of the second circuit.

20. The memory system according to claim 10, wherein the controller circuit comprises an interface circuit connectable to external host equipment, and the interface circuit is a circuit based on one of Serial Attached SCSI (SAS), PCI EXPRESS (PCIe), Serial Advanced Technology Attachment (SATA), or Universal Serial Bus (USB).

* * * * *